United States Patent [19]

Baggerman et al.

[11] Patent Number: 5,427,670
[45] Date of Patent: Jun. 27, 1995

[54] DEVICE FOR THE TREATMENT OF SUBSTRATES AT LOW TEMPERATURE

[75] Inventors: Jacobus A. G. Baggerman; Ronnie A. A. Hack; Pieter J. Q. Van Voorst Vader, all of Eindhoven, Netherlands

[73] Assignee: U.S. Philips Corporation, New York, N.Y.

[21] Appl. No.: 151,076

[22] Filed: Nov. 10, 1993

[30] Foreign Application Priority Data

Dec. 10, 1992 [EP]  European Pat. Off. ............ 92203861

[51] Int. Cl.⁶ ............................................. C23C 14/34
[52] U.S. Cl. ...................... 204/298.09; 204/298.15; 156/345
[58] Field of Search ............... 156/345; 118/724; 204/298.09, 298.15

[56] References Cited

U.S. PATENT DOCUMENTS

| | | | |
|---|---|---|---|
| 4,399,016 | 8/1983 | Tsukada et al. | 204/298.15 X |
| 4,682,566 | 7/1987 | Aitken | 118/724 |
| 4,838,978 | 6/1989 | Sekine et al. | 156/345 |
| 4,956,043 | 9/1990 | Kanetomo et al. | 156/345 |
| 5,085,750 | 2/1992 | Soraoka et al. | 204/298.09 X |
| 5,203,958 | 4/1993 | Arai et al. | 204/298.09 X |
| 5,223,113 | 6/1993 | Kaneko et al. | 204/298.09 X |
| 5,290,381 | 3/1994 | Nozawa et al. | 204/298.09 X |

FOREIGN PATENT DOCUMENTS 2566682 1/1986 France .

*Primary Examiner*—Nam Nguyen
*Attorney, Agent, or Firm*—Paul R. Miller; Michael J. Balconi-Lamica

[57] ABSTRACT

A device is set forth for the treatment of substrates at low temperature, which device is provided with a process chamber (1) in which a holder (2) is arranged which is provided with a support plate (3) having an upper side (4) on which a substrate (5) can be placed, and having a lower side (6) which forms a wall (7) of a cooling chamber (8). The cooling chamber (8) is provided with an inlet (9) comprising a feed opening (10) and an outlet (11, 12) comprising a drain opening (13) through which a cooling liquid can be passed into and from the cooling chamber (8). A first portion (23) of the wall (7) of the cooling chamber (8) formed by the lower side (6) of the support plate (3) projects further into the chamber (8) than does a second portion (20), while the first and the second portion (23, 20, respectively) merge fluently into one another. The drain opening (13) of the outlet (11, 12) of the cooling chamber (8) is positioned adjacent the second portion (20) of the wall (7). In such a device, a substrate (5) can be cooled in an efficient and homogeneous manner down to the temperature of, for example, liquid nitrogen.

13 Claims, 1 Drawing Sheet

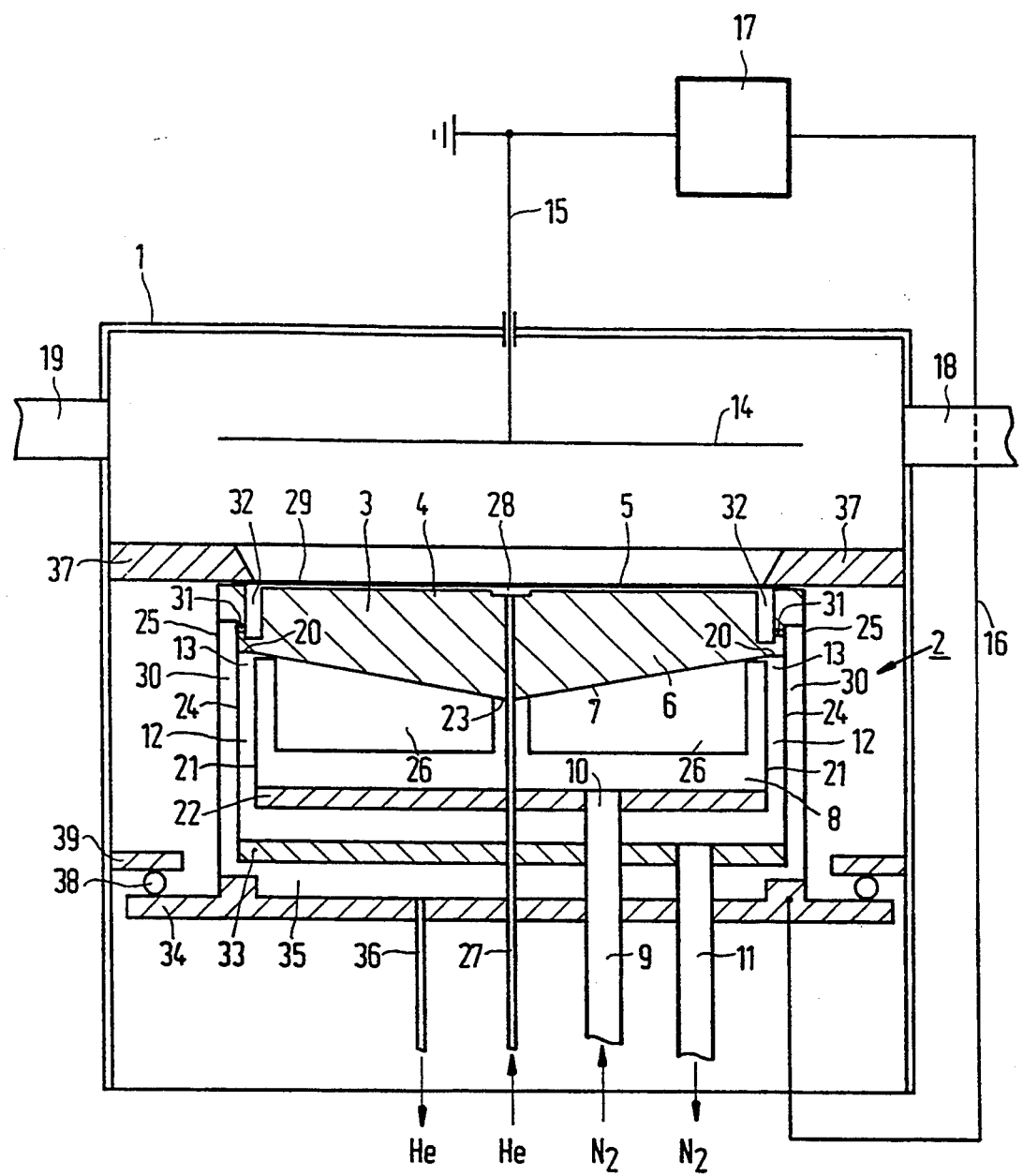

DEVICE FOR THE TREATMENT OF SUBSTRATES AT LOW TEMPERATURE

The invention relates to a device for the treatment of substrates at low temperature, which device is provided with a process chamber in which a holder is arranged which is provided with a support plate having an upper side on which a substrate can be placed and having a lower side which forms a wall of a cooling chamber, the first portion of this wall projecting into the chamber further than does a second portion, while this cooling chamber is provided with an inlet comprising a feed opening and an outlet comprising a drain opening through which a cooling liquid can be passed into and from the cooling chamber.

A substance like, for example liquid air or nitrogen can be passed through the cooling chamber so that a substrate placed on the holder, for example a glass plate or a slice of semiconductor material, is strongly cooled. The substrate may then be treated at a very low temperature. During such a treatment, for example, a layer of material is deposited on the substrate in a sputter deposition process, or a pattern is etched into a layer deposited on the slice by means of a plasma etching process. When a substrate is at such a low temperature during these processes, sputter deposition processes show a comparatively good step covering and plasma etching processes show a comparatively high degree of anisotropy and selectivity.

BACKGROUND OF THE INVENTION

U.S. Pat. No. 4,956,043 discloses a device of the kind mentioned in the opening paragraph in which the wall of the cooling chamber formed by the lower side of the support plate is of stepped design. A plane central horizontally situated portion forms the first portion of the wall, and a higher horizontal plane edge forms the second portion which projects less far into the cooling chamber. During operation, liquid nitrogen is adjusted to such a level in the cooling chamber that the first portion of the wall is continuously in the nitrogen.

It is found in practice that substrates cannot be optimally cooled in the known device. When liquid nitrogen is used as the cooling liquid, the substrates do not reach the temperature of liquid nitrogen. This is particularly true when the substrates are heated by incident ions or other particles during the etching or deposition processes.

SUMMARY OF THE INVENTION

The invention has for its object inter alia to provide a device in which the slices are better cooled so that, when liquid air or nitrogen is passed through the cooling chamber, the slices will indeed substantially reach the temperature of liquid air or nitrogen.

According to the invention, the device is for this purpose characterized in that the first and the second portion of the cooling chamber wall formed by the lower side of the support plate merge fluently into one another, the drain opening of the outlet of the cooling chamber being positioned adjacent the second portion of the wall. When a cooling liquid is passed through the cooling chamber now, it can flow along the lower side of the support plate and be subsequently discharged. The lower side of the support plate is then in contact with the cooling liquid over substantially its entire surface area, so that an optimal heat transfer between cooling liquid and support plate is safeguarded. This is not always the case in the known device in which the lower side of the support plate runs horizontally, while the liquid nitrogen in addition does not flow along the support plate. As a result, a layer of nitrogen gas is often evolved between the plane first portion of the wall and the liquid nitrogen, which hampers cooling. When liquid nitrogen is passed through the cooling chamber in the device according to the invention, the slice resting on the support plate substantially reaches the temperature of liquid nitrogen, even when it is also strongly heated by incident ions or other particles during the etching or deposition processes.

The wall of the cooling chamber, formed by the lower side of the support plate, may have various shapes, while the portion of the wall projecting less far into the cooling chamber may moreover have any position as desired on this wall. A practical solution is characterized in that the first portion of the cooling chamber wall formed by the lower side of the support plate is situated centrally in the cooling chamber, while the second portion forms an edge of the wall extending around the first portion. The wall may in this case consist of a number of plane portions which end in an angled edge such as is the case, for example, in a wall having the shape of a reversed pyramid. Preferably, however, the cooling chamber wall formed by the lower side of the support plate is a cone having an apex which forms the first portion centrally positioned in the cooling chamber. A wall formed in this way ensures that a good and homogeneous flow of the cooling liquid along this wall is realised, and thus a good and homogeneous cooling of the support plate, the more so when the drain opening of the outlet extends along the entire edge of the second portion of this wall.

An even more efficient cooling is obtained when the support plate is provided with cooling fins projecting into the cooling chamber, which fins according to the invention are provided with cooling liquid passage openings or which extend in the direction from the second to the first portion of the cooling chamber wall formed by the lower side of the support plate. An even more efficient cooling is obtained in this way, while the flow of the cooling liquid and thus its contact with the lower side of the support plate are hampered as little as possible.

In the device according to the invention, the holder is further provided with a gas line which extends centrally through the cooling chamber and the support plate and which issues into a discharge opening at the upper side of the support plate. A gas which ensures a good heat contact between the slice and the support plate may be passed through this gas line into the space enclosed between a slice placed on the support plate and the support plate. It is found in practice that such a good heat contact is obtained when helium is conducted into the space at a pressure of 1 to 10 torr.

Preferably, furthermore, the holder is constructed so as to have a double wall which encloses a space connected to an exhaust pump line, and is further provided with an annular groove provided at the upper side in the support plate. The gas provided between the slice and the support plate can be removed again through this double wall. An additional heat insulation of the cooling chamber is obtained in that a comparatively low gas pressure prevails in the space enclosed by the double wall. The substrates can be cooled with comparatively little cooling liquid as a result of this.

BRIEF DESCRIPTION OF THE DRAWING FIGURES

The invention will be explained in more detail below by way of example with reference to a drawing.

The sole FIGURE of this drawing is a diagrammatic cross-section of a device according to the invention.

DESCRIPTION OF THE INVENTION

The sole FIGURE diagrammatically and in cross-section shows a device for the treatment of substrates, in this example semiconductor slices, at low temperatures. This device is provided with a process chamber 1 in which a holder 2 is arranged. This holder 2 is provided with a support plate 3 having an upper side 4 on which a semiconductor slice 5 can be placed. The support plate 3 has a lower side 6 which forms a wall 7 of a cooling chamber 8. The holder 2 is further provided with an inlet 9 comprising a feed opening 10 and an outlet 11, 12 comprising a drain opening 13 through which a cooling liquid can be passed into and from the cooling chamber 8.

It is possible to pass, for example, liquid nitrogen through the cooling chamber 8, whereby a semiconductor slice 5 placed on the holder is strongly cooled. The slice 5 may then be treated at a very low temperature. The FIGURE shows a plasma etching device in which a layer deposited on the slice 5 can be etched into a pattern by means of a plasma etching process. The device comprises, in addition to the holder 2, a plane electrode 14 arranged parallel to the slice 5. This electrode 14 is grounded via a cable 15, while the holder 2 is connected to a high-frequency supply source 17 via a cable 16. A plasma is generated between the electrode 14 and the holder 2 in a gas mixture by means of this supply source 17, the gas mixture being introduced into the reaction chamber 1 through a gas supply line 18. Residual gases and gaseous reaction products are discharged through a pumping line 19.

The holder 2 may alternatively be used in a sputter deposition device. Such a device is similar to the etching device shown, but instead of the electrode 14 a sputtering target is arranged opposite the support plate 3 in a sputter deposition device. A plasma is also generated in a sputter deposition device between the support plate and the sputtering target, in practice usually in argon or a gas mixture comprising argon. In such a device, for example, a layer of material such as aluminium is deposited on the slice.

When a semiconductor slice is at a low temperature close to that of liquid nitrogen during a plasma etching process or a sputter deposition process, the sputter deposition process will show a comparatively good step covering and the plasma etching process will have a comparatively high degree of anisotropy and selectivity.

A first portion 23 of the wall 7 of the cooling chamber 8 projects further into the cooling chamber 8 than does a second portion 20. According to the invention, the first portion 23 and the second portion 20 merge fluently into one another, while the drain opening 13 of the outlet 11, 12 is situated adjacent the second portion 20 which has the highest position. When a cooling liquid is now passed through the cooling chamber 8, this liquid will flow along the wall 7 to the highest, second portion 20 thereof and is subsequently removed. The wall 7 of the cooling chamber 8 as a result is continuously in contact with the cooling liquid over substantially its entire surface, whereby an optimal heat transfer between cooling liquid and support plate 3 is safeguarded. When liquid nitrogen is passed through the cooling chamber, the slice 5 lying on the support plate 3 will substantially assume the temperature of liquid nitrogen even if this slice is strongly heated by incident ions or other particles during the etching or deposition processes.

The wall 7 of the cooling chamber 8 formed by the lower side 6 of the support plate 3 may have various shapes, while the portion 23 of this wall projecting farther into the cooling chamber may in addition be situated in any location on this wall 7, as desired. It is convenient when the first portion 23 of the wall 7 is centrally situated in the cooling chamber, while the second portion forms an edge 20 of the wall which extends around the first portion. The wall may then consist of a number of plane portions which end in an angled edge such as, for example, a wall having the shape of a reversed pyramid. Preferably, the wall 7 is a cone with an apex which forms the first portion 23 centrally situated in the cooling chamber. A wall of this shape ensures that a good and homogeneous flow of the cooling liquid along this wall is realised, and thus a good and homogeneous cooling of the support plate.

The drain opening 13 of the outlet 11, 12 extends along the entire edge 20. The holder 2 is provided with a double wall 24, 25 comprising a cylindrical inner wall 24 and a cylindrical outer wall 25. The portion of the outlet 11, 12 situated near the drain opening 13 is formed by a space 12 which is enclosed between the wall 21 of the cooling chamber 8 and the inner wall 24 of the holder 2.

The support plate 3 is provided with cooling fins 26 which project into the cooling chamber and which are provided, according to the invention, with passage openings (not shown) for the cooling liquid, or which extend in the direction from the second 20 to the first portion 23 of the wall 7 of the cooling chamber 8 formed by the lower side 6 of the support plate 3. A more efficient cooling is obtained in this way, while the flow of the cooling liquid, and thus its contact with the lower side 6 of the support plate 3 are hampered as little as possible.

The holder 2 according to the invention is further provided with a gas line 27 which extends centrally through the cooling chamber 8 and the support plate 3 and which issues into a discharge opening 28 at the upper side 4 of the support plate 3. Through this gas line 27 a gas ensuring a good heat contact between the slice 5 and the support plate 3 may be conducted into the space 29 enclosed by a slice 5 placed on the support plate 3 and the upper side 4 of the support plate 3. It is found in practice that such a good heat contact is obtained when helium with a pressure of 1 to 10 torr is fed into the space 29.

The double wall 24, 25 of the holder 2 encloses a space 30 which is connected through a number of holes 31 to an annular groove 32 provided at the upper side 4 in the support plate 3. The holder is further provided with a double bottom 33, 34 enclosing a space 35. The bottom 33 is connected to the inner wall 24 and the bottom 34 to the outer wall 25. The gas introduced between the slice 5 and the support plate 3 may be removed again through the space 30 between the double walls 24, 25 and the space 35 in the double bottom 33, 34, which spaces are in connection with an exhaust pump line 36. An additional heat insulation of the cooling chamber 8 is obtained because a comparatively low gas pressure prevails then in the spaces 30 and 35. The slices can be cooled with comparatively little cooling liquid as a result of this.

The slice 5 is pressed against the upper side 4 of the support plate 3 by means of a ring 37 which is fixedly positioned in the chamber 1. The bottom 34 of the holder 2 is connected in a gaslight manner by means of an O-ring 38 to a flange 39 fastened to the chamber 1. The gas lines 27 and 36 and the inlet and outlet 9 and 11 for the cooling liquid are passed through one or several of the bottoms 22, 33 and 34 in a gaslight manner. Furthermore, a heater element and a thermocouple may be provided in the support plate 3 in a known manner in order to bring the slice to a temperature above that of liquid nitrogen in a controlled manner. The support plate 3 is made of a material which conducts heat well such as, for example, copper, while the other parts of the holder 2 are made, for example, of stainless steel.

We claim:

1. A device for treating substrates at low temperatures comprising a process chamber; a holder structure arranged in said chamber; a support plate disposed in said holder structure, said support plate having an upper side for supporting a substrate and a lower side; a cooling chamber having a wall of said lower side; inlet means for passing cooling liquid into said cooling chamber; outlet means including a drain opening for passing said cooling liquid from said cooling chamber; and structural means for maintaining said substrate at a temperature of said cooling liquid by passing said cooling liquid along said wall, said structural means including said wall of said lower side having a first portion extending centrally into said cooling chamber and a second portion disposed annularly at an edge of said wall, said first portion merging fluently with said second portion, and said drain opening being disposed adjacent to and annularly about said second portion at said edge of said wall.

2. A device according to claim 1, wherein said wall at said lower side of said support plate is conically shaped, said first portion extending into said cooling chamber to a centrally located apex of the conically shaped wall.

3. A device according to claim 2, wherein said drain opening extends along the entire edge of said second portion of said wall.

4. A device according to claim 3, wherein said support plate includes a plurality of cooling fins at said lower side, said cooling fins projecting into said cooling chamber, and said cooling fins having openings for passage of said cooling liquid.

5. A device according to claim 3, wherein said support plate include a plurality of cooling fins at said lower side, said cooling fins projecting into said cooling chamber, and said cooling fins extending from said second portion through said first portion of said wall.

6. A device according to claim 1, wherein said support plate includes a plurality of cooling fins at said lower side, said cooling fins projecting into said cooling chamber, and said cooling fins having openings for passage of said cooling liquid.

7. A device according to claim 1, wherein said support plate include a plurality of cooling fins at said lower side, said cooling fins projecting into said cooling chamber, and said cooling fins extending from said second portion through said first portion of said wall.

8. A device according to claim 1, wherein said cooling liquid is one of liquid nitrogen or liquid air, and said substrate is maintained at liquid nitrogen temperature or liquid air temperature.

9. A device according to claim 1, wherein either etching of said substrate or deposition on said substrate can be carried out.

10. A device according to claim 1, wherein said cooling chamber has a double wall, said double wall enclosing a discharge space for said cooling liquid.

11. A device according to claim 1, wherein said holder includes a gas line extending centrally through said cooling chamber and said support plate, said gas line opening into a discharge opening at said upper side of said support plate.

12. A device according to claim 11, wherein said holder has a double wall structure to enclose a space connected to an exhaust discharge pumping line.

13. A device according to claim 12, wherein said space is connected to an annular groove in said upper side of said support plate.

* * * * *